United States Patent [19]

Ohsawa

[11] 4,405,971
[45] Sep. 20, 1983

[54] ELECTRICAL CIRCUIT APPARATUS

[75] Inventor: Mitsuo Ohsawa, Kanagawa, Japan

[73] Assignee: Sony Corporation, Tokyo, Japan

[21] Appl. No.: 212,529

[22] Filed: Dec. 3, 1980

[30] Foreign Application Priority Data

Dec. 10, 1979 [JP] Japan .................................. 54-160049

[51] Int. Cl.³ ............................................. H05K 1/14
[52] U.S. Cl. .................................. 361/401; 361/412; 361/414
[58] Field of Search ............... 361/386, 388, 412, 401, 361/414; 174/68.5

[56] References Cited

U.S. PATENT DOCUMENTS

| | | | |
|---|---|---|---|
| 2,495,546 | 1/1950 | Posen | 361/401 X |
| 2,777,039 | 1/1957 | Thias | 361/401 X |
| 3,192,307 | 6/1965 | Lazar | 361/401 X |
| 3,219,886 | 11/1965 | Katzin | 361/401 X |
| 3,249,818 | 5/1966 | Hwang | 361/401 |
| 3,317,797 | 5/1967 | Webb | 361/388 |
| 3,480,836 | 11/1969 | Aronstein | 361/386 |
| 3,777,220 | 12/1973 | Tatsuko | 361/386 X |
| 4,120,041 | 10/1978 | Hayakawa | 361/414 X |
| 4,215,387 | 7/1980 | Negishi | 361/414 X |

FOREIGN PATENT DOCUMENTS 2413016  7/1979 France .................................. 361/386

Primary Examiner—R. R. Kucia
Attorney, Agent, or Firm—Lewis H. Eslinger; Alvin Sinderbrand

[57] ABSTRACT

Electrical circuit apparatus comprising a mother board having pattern of conductive leads on a surface thereof and including at least one opening therein of predetermined size and shape into which is fitted a daughter board which is structurally distinct from the mother board, the mother and daughter boards being of substantially the same thickness. Electrical circuit components are mounted on the composite board which is formed by the combination of the mother and daughter boards, these electrical circuit components having electrodes which are electrically connected to the pattern of conductive leads of the composite board. Preferably, both the mother and daughter boards are provided with patterns of conductive leads. The leads on the mother and daughter boards are interconnected, either directly or through circuit elements. Also disclosed is a process for manufacturing this composite board.

3 Claims, 28 Drawing Figures

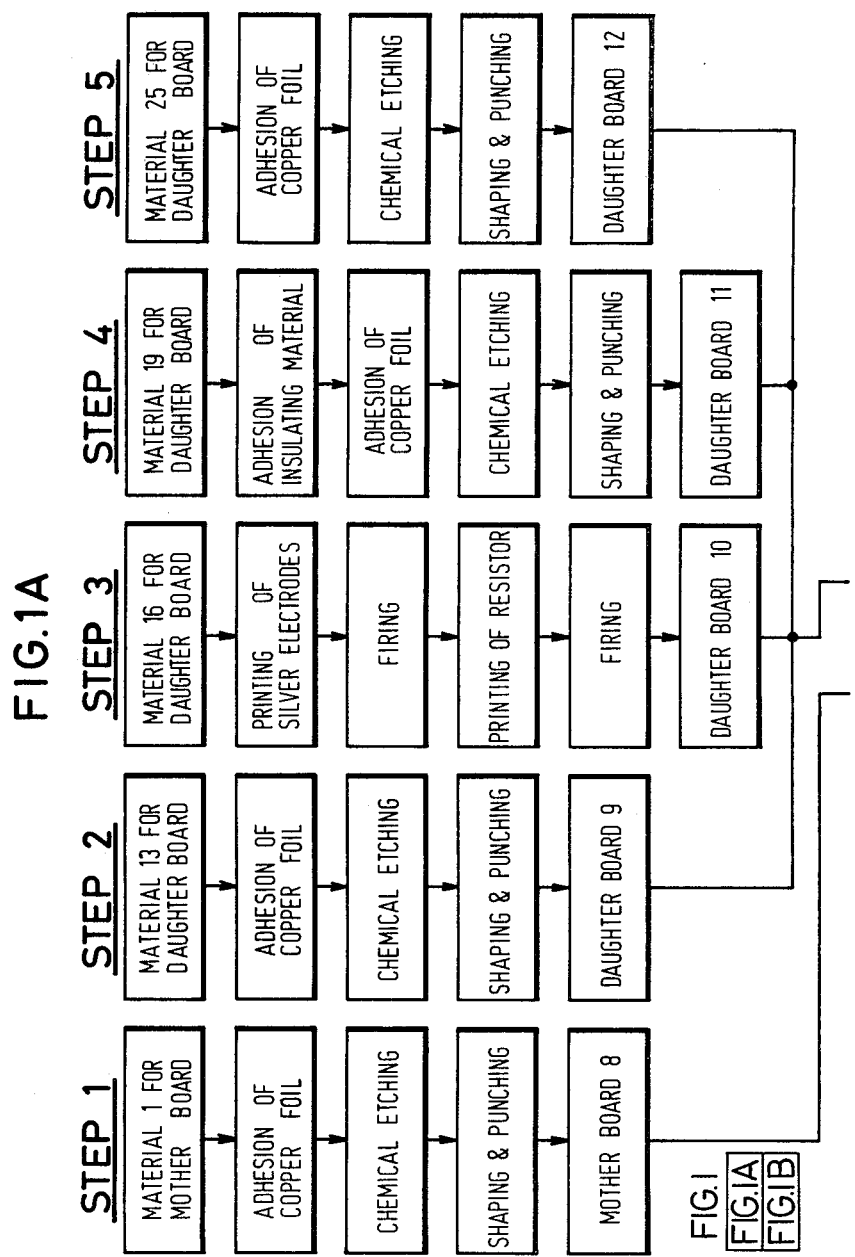

FIG.1B
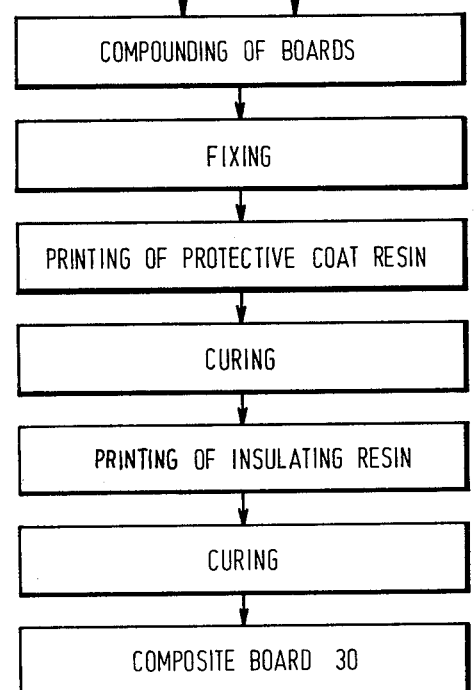
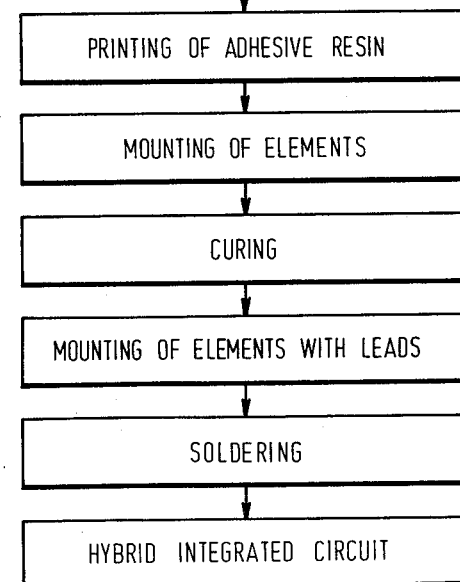

FIG. 2A FIG. 2 | FIG.2A | FIG.2B
STEP 5
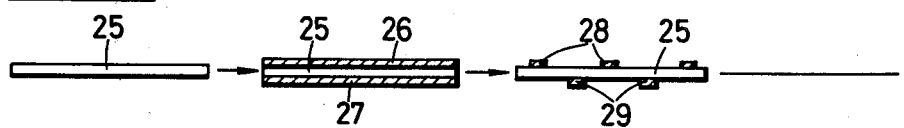
STEP 4
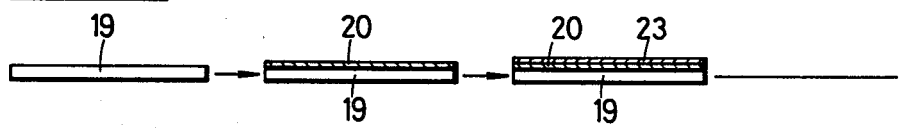
STEP 3
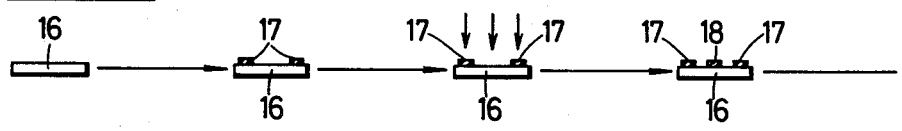
STEP 2
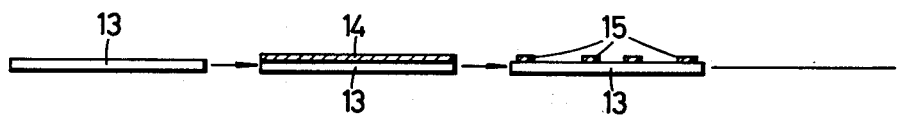
STEP 1
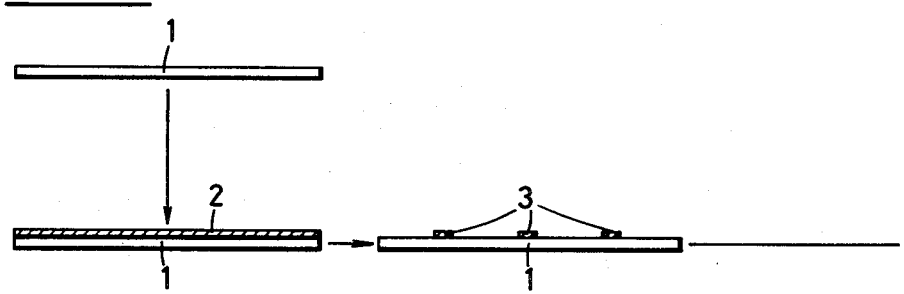

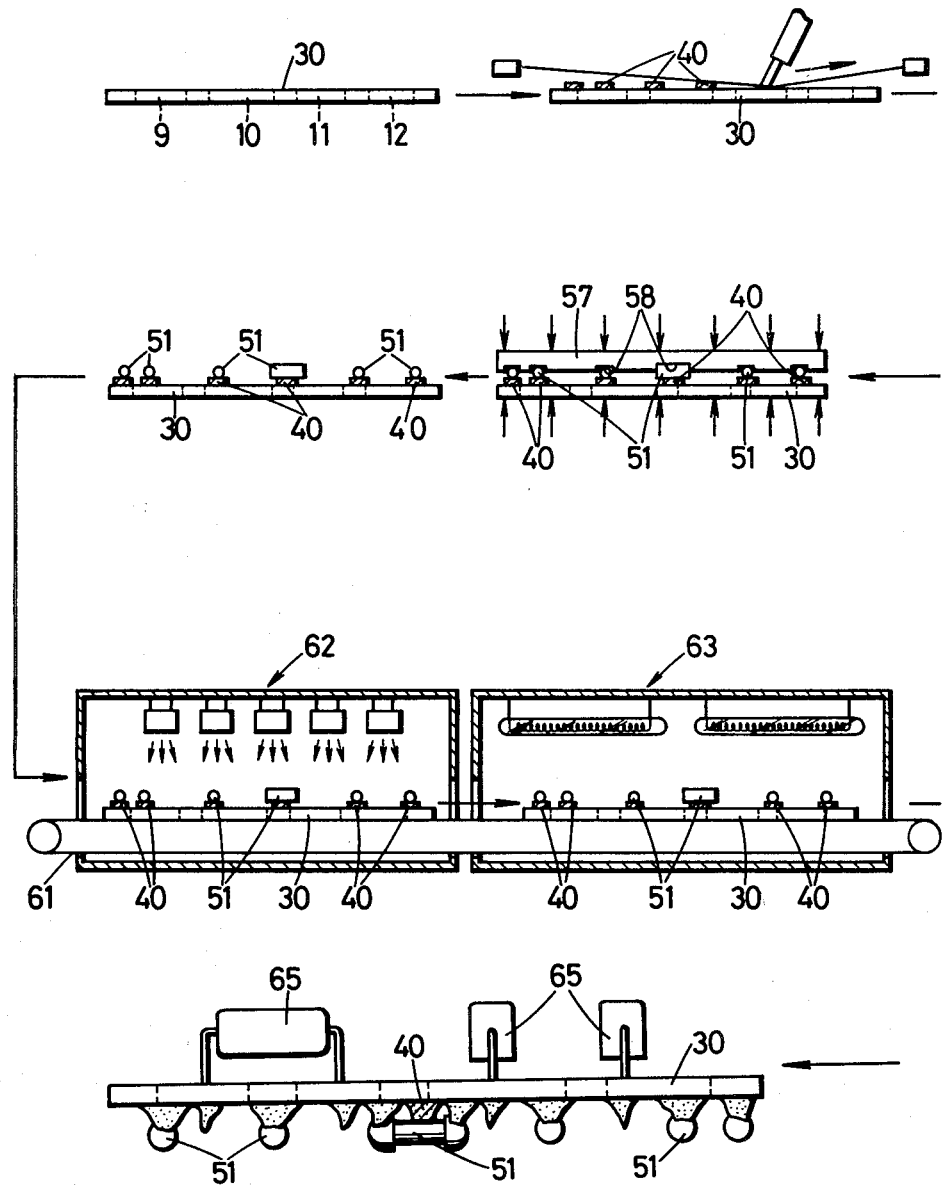

ELECTRICAL CIRCUIT APPARATUS

BACKGROUND OF THE INVENTION

This invention relates to improved electrical circuit apparatus, and a method of manufacturing same, and more particularly, to such apparatus which is relatively inexpensive to manufacture and is capable of performing different circuit operations which, heretofore, were carried out by separate circuits mounted on separate circuit boards.

Although integrated circuit technology is used to manufacture self-contained circuits which are capable of operating independently, without requiring substantial interconnections with other circuitry, many circuit applications still require that integrated circuits and discrete components be coupled to each other in order to perform desired circuit functions in various different types of devices. In general, different circuit functions may be performed by circuitry mounted on separate circuit boards, commonly referred to as printed circuit boards. For example, in a radio receiver, various ones of these printed circuit boards are provided, some having radio tuning circuitry thereon, and others having pre-amplifiers, power amplifiers, and the like. One of ordinary skill in the art will appreciate that other devices likewise may be provided with various printed circuit boards having different circuit elements mounted thereon for carrying out particular circuit functions.

In an attempt to minimize the manufacturing costs of such devices, it has been proposed that the various circuit boards which are used be of substantially the same size. Likewise, to facilitate assembly, it has been proposed that as many of the circuit elements as possible be of the same form and shape. Thus, irrespective of the particular functions to be performed thereby, the circuit elements and circuit boards upon which such elements are to be mounted are attempted to be standardized. Many of such standardized circuit elements are provided with relatively small, or even no, conducting leads. Hence, other connections, such as solder, are needed to interconnect the electrodes of such circuit elements to the conductive patterns which generally are provided on at least one surface of the circuit boards.

A typical circuit board which is used to mount circuit element thereon is formed of, for example, a phenolic resin. A pattern of conductive leads is provided on at least one surface of this circuit board by depositing a copper leaf thereon and etching that leaf so as to form the desired conductive pattern. One advantage of using a phenolic resin board is that such boards are relatively inexpensive. Hence, the overall cost of the circuitry which is formed by mounted circuit elements on a phenolic resin board likewise is relatively inexpensive. Another advantage is that such phenolic resin circuit boards have a relatively low thermal radiation coefficient, that is, a low coefficient of thermal diffusion. Because of this, repairs to, or replacement of, circuit elements mounted on such a phenolic resin board may be achieved by using a soldering iron. Also, these boards may be processed readily, that is, they may be cut, shaped and otherwise manipulated, as desired.

However, if an exothermic circuit element is mounted on a phenolic resin board, that is, a circuit element which emits substantial heat, that heat can be dispersed best by providing a heat sink on the board. This is because the low coefficient of thermal diffusion of the phenolic resin board does not facilitate dispersal of the heat. This adds to the overall labor, and thus cost, of manufacturing circuits in which exothermic circuit elements are used, such as power amplifiers.

Another disadvantage of phenolic resin boards is that such boards have measurable dielectric constants. Because of such dielectric constants, the phenolic resin boards influence the response characteristics of circuits mounted thereon that are used in higher frequency ranges, such as very high frequency (VHF) circuits, ultra-high frequency (UHF) circuits, super high frequency (SHF) circuits and extremely high frequency (EHF) circuits. For example, the phenolic resin circuit board may deleteriously affect the signal-to-noise (S/N) ratio as well as the high impedance of such circuits. Furthermore, surface leakage of the phenolic resin board may present a problem to the satisfactory performance of these circuits.

Accordingly, where circuitry is mounted on a circuit board for use in the higher frequency ranges, other materials, such as glass epoxy resin, should be used. However, with glass epoxy resin, a high performance ink for a solder mask frequently must be coated thereon. The use of a glass epoxy resin is relatively expensive and additional processing steps are needed when the glass epoxy resin board is used to support circuit elements. Furthermore, large areas of a glass epoxy resin board must be printed with conductive ink so that a preferable distribution of circuit elements may be mounted, thereby avoiding localized concentrations. In place of a glass epoxy resin, it has been proposed to use alumina ceramic boards. However, such alumina ceramic circuit boards suffer from many of the same disadvantages noted above with respect to glass epoxy resin boards.

When the circuit board is to have exothermic circuit elements mounted therein, neither phenolic resin nor glass epoxy resin are optimum materials. Rather, aluminum or alumina ceramic circuit boards have been used. However, these types of circuit boards are relatively expensive to manufacture and, moreover, because of their favorable coefficients of thermal diffusion, it is relatively difficult to repair such circuit boards by using a soldering iron.

Therefore, it is believed that there is a definite need for improved circuit apparatus, including circuit boards which are readily adapted to have different types of circuit elements mounted thereon, while being free of the defects and disadvantages discussed above.

OBJECTS OF THE INVENTION

Therefore, it is an object of the present invention to provide improved electrical circuit apparatus which overcomes the aforenoted disadvantages.

Another object of this invention is to provide improved electrical circuit apparatus including a composite circuit board upon which different types of circuit elements may be mounted, which composite circuit board is of relatively low cost to manufacture, does not interfere with the operation of the circuit elements mounted thereon, and permits relatively simple repairs by way of, for example, a soldering iron.

A further object of this invention is to provide improved electrical circuit apparatus, including a composite circuit board having certain areas which are structurally distinct from other areas.

An additional object of the present invention is to provide apparatus of the aforenoted type wherein the structural distinctions of the different areas of the composite circuit board permit different types of circuit elements to be mounted thereon.

Yet another object of this invention is to provide apparatus of the aforenoted type in which each area of the composite circuit board is particularly adapted to have a particular type of circuit mounted thereon.

A still further object of this invention is to provide improved apparatus of the aforenoted type which exhibits superior performance and which is efficiently manufactured.

Yet another object of this invention is to provide a method of manufacturing the electrical circuit of the aforenoted type.

An additional object of this invention is to provide a method of assembling, automatically, the various component parts and circuit elements inexpensively and in an efficient manner so as to manufacture the electrical circuit apparatus of the aforenoted type.

Another object of this invention is to provide a method of manufacturing an electrical circuit of the aforenoted type, the method being constituted by a lesser number of individual steps than heretofore has been possible.

Various other objects, advantages and features of the present invention will become readily apparent from the ensuing detailed description, and the novel features will be particularly pointed out in the appended claims.

SUMMARY OF THE INVENTION

In accordance with this invention, electrical circuit apparatus comprises a mother board having a pattern of conductive leads disposed on a surface thereof and having at least one daughter board fitted into a corresponding opening to the mother board, the mother and daughter boards being of substantially the same thickness but being structurally distinct from each other. Electrical circuit components are mounted on the composite board which is formed of the mother and daughter boards, these electrical circuit components having electrodes which are electrically connected to the pattern of conductive leads. Preferably, a pattern of conductive leads also is disposed on a surface of the daughter board, and the leads on the daughter board are electrically connected to the leads on the mother board, either directly or by way of interconnecting circuit elements. The present invention also relates to an improved method of manufacturing this electrical circuit apparatus.

BRIEF DESCRIPTION OF THE DRAWINGS

The following detailed description, given by way of example, will best be understood in conjunction with the accompanying drawings in which:

FIGS. 1A and 1B are block diagrams which represent the steps by which the electrical circuit apparatus of the present invention is manufactured;

FIGS. 2A and 2B are schematic representations of most of the steps illustrated in FIGS. 1A and 1B;

FIGS. 3A and 3B are schematic representations of the final steps illustrated in FIGS. 1A and 1B;

DETAILED DESCRIPTION OF THE PREFERRED EMBODIMENTS

Figure 2B:
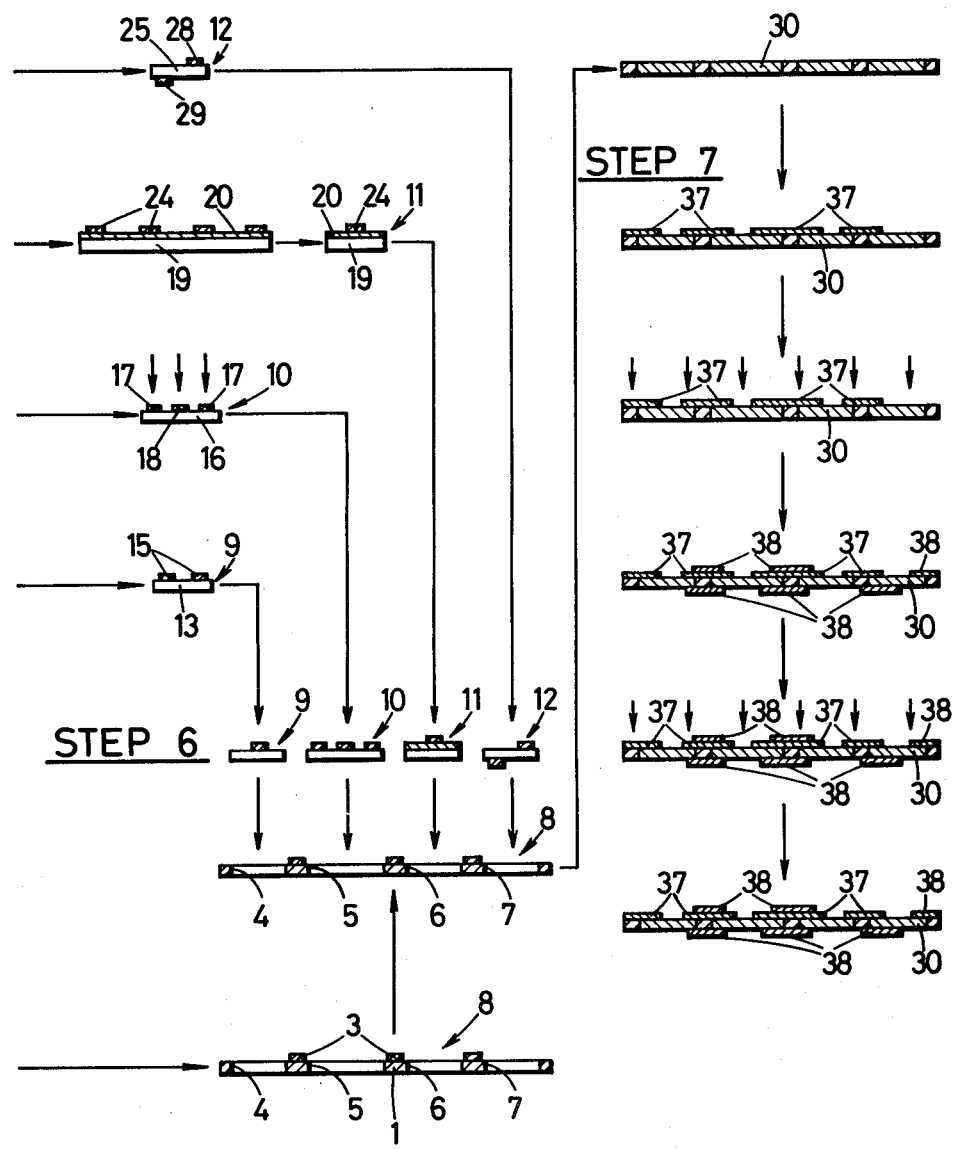

Referring now to the drawings, and particularly, to FIGS. 1A, 1B and 2A, 2B, the method by which a composite circuit board for the electrical circuit apparatus of the present invention is manufactured, now will be described. In step 1, the mother board is manufactured from a slab of material 1, which may be any material conventionally used as a circuit board, such as a phenolic resin. The use of phenolic resin as the material for the mother board is preferred because it is relatively inexpensive and is readily processed. A layer of copper foil 2 then is adhesively applied to the slab of material 1; and this layer of copper foil is chemically etched so as to form a pattern of the electrically conductive leads 3. As will become appreciated, the leads 3 of remaining copper foil will provide electrical interconnections between various circuit components that are used for the electrical circuit apparatus to be mounted upon the mother board.

After the pattern of conductive leads 3 is formed, at least one opening of predetermined shape is formed, as by shaping and punching material 1. For example, and as shown in FIG. 2, openings 4, 5, 6 and 7 are formed in material 1. This resultant product, comprised of material 1 having openings 4, 5, 6 and 7 therein and having a pattern of conductive leads 3 thereon, constitutes mother board 8. These openings in the mother board are adapted to receive respective daughter boards having substantially the same size and shape of the corresponding openings. As will be described, such daughter boards are press-fit into these openings.

For the purpose of the present specification, the expression "mother board" is intended to refer to a main printed circuit board upon which various circuit components may be mounted, and which is particularly adapted to receive additional, individual circuit boards. As discussed above, mother board 8 has respective openings therein, each of these respective openings being adapted to receive a corresponding one of additional circuit boards. The expression "daughter board" is intended to refer to these additional circuit boards which are inserted into corresponding openings of mother board 8. It will become apparent that, if desired, such daughter boards may be secured to peripheral portions of the mother board so as to be joined therewith.

In addition to providing openings 4, 5, 6 and 7 in mother board 8, through-holes, such as of the type adapted to receive conducting leads provided on circuit components, also may be formed in the mother board. Final shaping and finishing of mother board 8 may be carried out concurrently with the formation of openings 4, 5, 6 and 7 therein.

In addition to forming mother board 8, steps 2, 3, 4 and 5 represent the formation of respective daughter boards. Each daughter board may be formed concurrently with the forming of mother board 8 or, if desired, such daughter boards may be formed in advance of the formation of the mother board and may be supplied to the manufacturing apparatus so as to be press-fit into the respective openings of the mother board. Steps 2, 3, 4 and 5 represent the formation of daughter boards that are structurally distinct from each other, as well as from the mother board. However, if desired, a plurality of daughter boards, all of the same structure, may be provided. Also, any combination of daughter boards may be used for insertion into openings 4, 5, 6 and 7 of mother board 8.

The daughter board formed by step 2 may be particularly adapted to have circuit elements mounted thereon so as to form a so-called high-performance circuit, such as an audio preamplifier, a magnetic head amplifier, or the like. For this purpose, the daughter board formed by step 2 is constructed of a slab of glass epoxy resin 13 upon which a layer of copper foil 14 is adhesively applied. Then, the layer of copper foil is subjected to chemical etching so as to form a pattern 15 of conductive leads on the upper surface, for example, of glass epoxy resin 13. The resultant product is shaped, as by cutting, punching and finishing, to form daughter board 9 whose size and shape is substantially identical to the size and shape of opening 4 in mother board 8. That is, daughter board 9 is particularly adapted to be press-fit to opening 4. In addition to particularly shaping daughter board 9, through-holes may be provided therein, as desired. It is appreciated that such through-holes may be used for conductive leads to pass therethrough. The provision of such through-holes is, of course, determined by the structure and characteristics of the particular circuit for which daughter board 9 has been formed.

Step 3 represents the formation of a daughter board 10 which is particularly adapted for use with a super-high frequency circuit, such as a high frequency tuner. For this purpose, daughter board 10 may be constructed of a slab of alumina ceramic 16 that has been machine-finished to a size and shape which is substantially identical to the size and shape of opening 5 in mother board 8. Silver electrodes 17 then may be deposited, as by printing, on the upper surface of alumina ceramic 16. These silver electrodes are fixed to the alumina ceramic by firing at a temperature on the order of about 800° to 900° C. If the high frequency circuit with which daughter board 10 is to be used includes, for example, a resistive element, a suitable resistor 18 may be formed on alumina ceramic 16 by conventional printing techniques. This resistor then is fixed by firing in the same manner as discussed above with respect to the fixing of electrodes 17. A resultant daughter board 10, having electrodes 17 and resistor 18 thereon, is adapted to be received in opening 5 of mother board 8.

Figure 4:
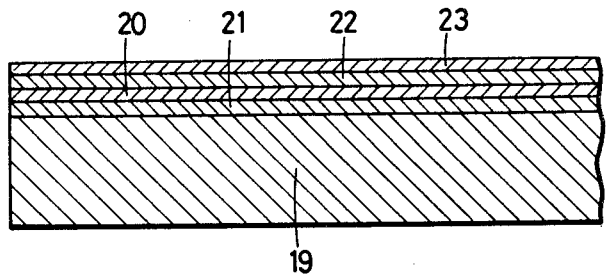
FIG. 4 is a cross-sectional view of a daughter board made from aluminum, and which is used with the present invention.

Step 4 represents the formation of a daughter board 11 which is particularly adapted to have an exothermic circuit, such as a power amplifier, mounted thereon. For this purpose, daughter board 11 is constructed of a slab of aluminum plate 19 which, as is appreciated, has a high coefficient of thermal diffusion. Since this aluminum is electrically conductive, a layer of insulating material 20, such as a polymer film, is coated upon the upper surface thereof. If desired, other insulating materials may be used in place of film 20, and such other materials may be suitably adhesively applied to aluminum plate 19. Thereafter, a layer of copper foil 23 is adhesively applied to the upper surface of insulating layer 20. For example, and as shown in the sectional view of FIG. 4, copper foil 23 may be secured to insulating layer 20 by a layer of adhesive material 22. FIG. 4 also represents that insulating layer 20 may be secured to aluminum plate 19 by an adhesive layer 21.

After copper foil 23 is applied, a pattern of conductive leads 24 is formed by conventional etching techniques. That is, the copper foil is chemically etched in order to form this pattern 24. Thereafter, daughter board 11 is formed to proper size and shape, as by conventional punching and shaping techniques. Also, if desired, through-holes may be provided through insulating layer 20 and aluminum plate 19. The resultant daughter board 11 is readily adapted to be press-fit into opening 6 of mother board 8.

Step 5 represents the formation of a daughter board 12 which is particularly adapted to have circuit elements mounted thereon in an arrangement which exhibits relatively low density. That is, daughter board 12 minimizes the mounting density of circuit elements so as to avoid any localized concentration of such elements which could deleteriously affect circuit operation. Daughter board 12 is constructed of a slab of material 25 which, for example, may be a phenolic resin. Although material 25 is the same as material 1, that is, it is the same starting material as was used in the formation of mother board 8, layers of copper foil 26 and 27 are applied to both surfaces of slab 25. Thus, by reason of the coating of both surfaces of material 25 with copper foil 26 and 27, daughter board 12 is seen to be structurally distinct from mother board 8. After copper foils 26 and 27 are adhesively applied to material 25, patterns 28 and 29 are formed by chemically etching foils 26 and 27 in a desired, predetermined configuration. Then, daughter board 12 is formed into desired size and shape by conventional shaping and punching techniques, resulting in a daughter board whose size and shape is substantially identical to the size and shape of opening 7 in mother board 8. Also, if desired, through-holes may be formed in material 25.

The resultant daughter boards 9, 10, 11 and 12 are of equal thickness to each other and also to the thickness of mother board 8. That is, each daughter board, including the pattern of conductive leads thereon, is equal in thickness to the mother board, the latter including the pattern of conductive leads. For example, if leads 15 on daughter board 9 are equal in thickness to leads 3 on mother board 8, then the thickness of material 13 is equal to the thickness of material 1. Preferably, the thickness of combined layers 19 and 20 of daughter board 11 is equal to the thickness of material 1; and the thickness of conductive leads 24 is equal to the thickness of conductive leads 3.

In assembling the respective daughter boards and mother board to form a composite board, all of the daughter boards may be fitted into the respective openings of the mother board in one operation, that is, concurrently. Alternatively, respective ones of the daughter boards may be fitted into the openings of mother board 8 in sequence. For example, first daughter board 9 may be fitted into opening 4, then daughter board 10 may be fitted into opening 5, and so on. Furthermore, and as is appreciated, one or more of daughter boards 9, 10, 11 and 12 may be omitted; or a particular type of daughter board may be used in two or more openings. Also, the particular material and structural arrangement of the respective daughter boards described above merely are illustrative. A daughter board may be formed of other material and may exhibit a different structure than has been discussed. It may be appreciated that the type, material, structural arrangement and number of daughter boards which are to be used with mother board 8 is dependent upon the purpose, operation, size, and the like of the finished electrical circuit formed therefrom. Still further, and as mentioned above, steps 2–5 may be performed concurrently or individually. One or more of these steps also may be performed concurrently with step 1 or, if desired, the respective daughter boards may be previously formed and awaiting insertion into a mother board that is formed in accordance with the process represented by step 1.

Figure 5:
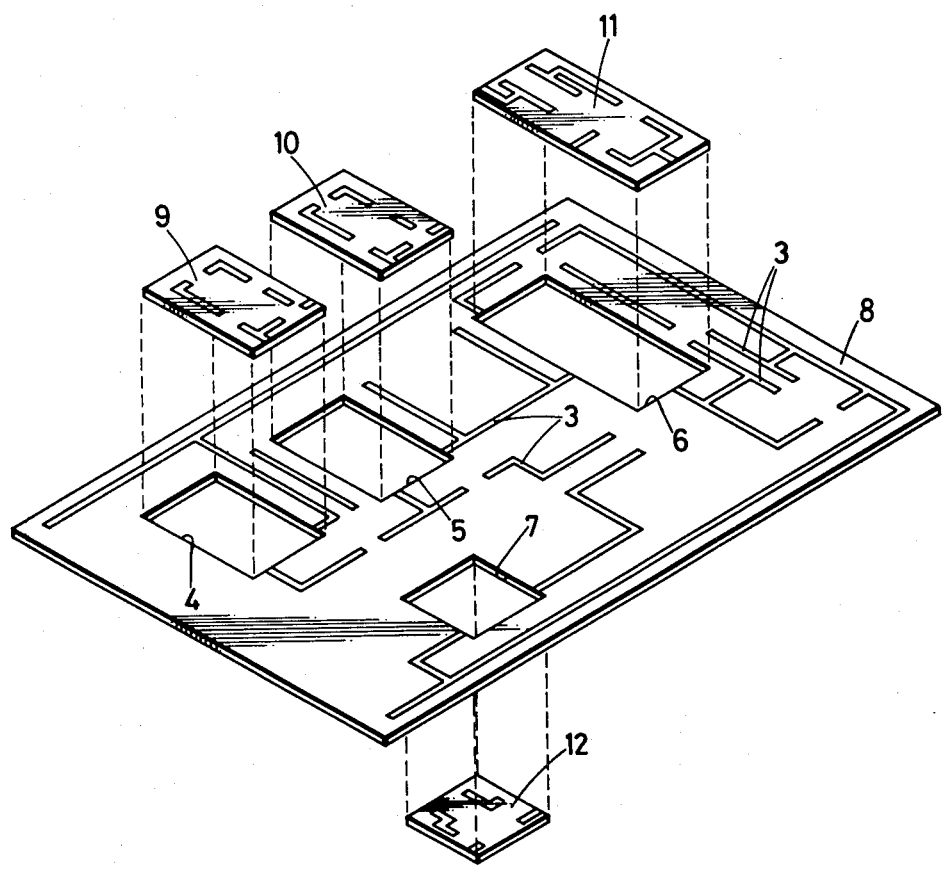
FIG. 5 is an exploded perspective view illustrating a composite circuit board in accordance with the present invention.

Step 6 represents the actual insertion of daughter boards 9, 10, 11 and 12 into openings 4, 5, 6 and 7, respectively, of mother board 8. This insertion of the daughter boards into corresponding openings of the mother board is referred to in FIG. 1 as "compounding" of the mother and daughter boards. FIG. 5 represents the each daughter board is of the proper size and shape so as to be substantially identical to the particular opening in mother board 8 in which that daughter board is received. Also, and as mentioned above, each daughter board is of equal thickness, and this thickness is equal to the thickness of mother board 8. As one example, the thickness of the respective circuit boards is on the order of about 1.6 mm. Of course, the actual thickness of the respective circuit boards is dependent upon the particular function which is to be performed by the overall electrical circuit formed on these boards. The insertion of daughter boards 9, 10, 11 and 12 into openings 4, 5, 6 and 7 of mother board 8 results in a composite board 30, which exhibits a uniform surface from mother board to daughter board, such as shown in FIG. 2. This uniform surface of composite board 30 advantageously is used to facilitate the subsequent steps in manufacturing the electrical circuit. More particularly, this uniformly flat surface of the composite board simplifies the process in which various resins are applied, such as the protective coating for a solder resist, an insulating coating, an adhesive coating, and the like. Such coatings are applied accurately and uniformly because of the absence of irregularities on the surface of composite board 30. Also, and as will be described, this uniform surface of the composite board permits ready transfer of circuit elements from, for example, a template to the composite board, while assuring that such transferred components are properly secured to the composite board.

Figure 6:
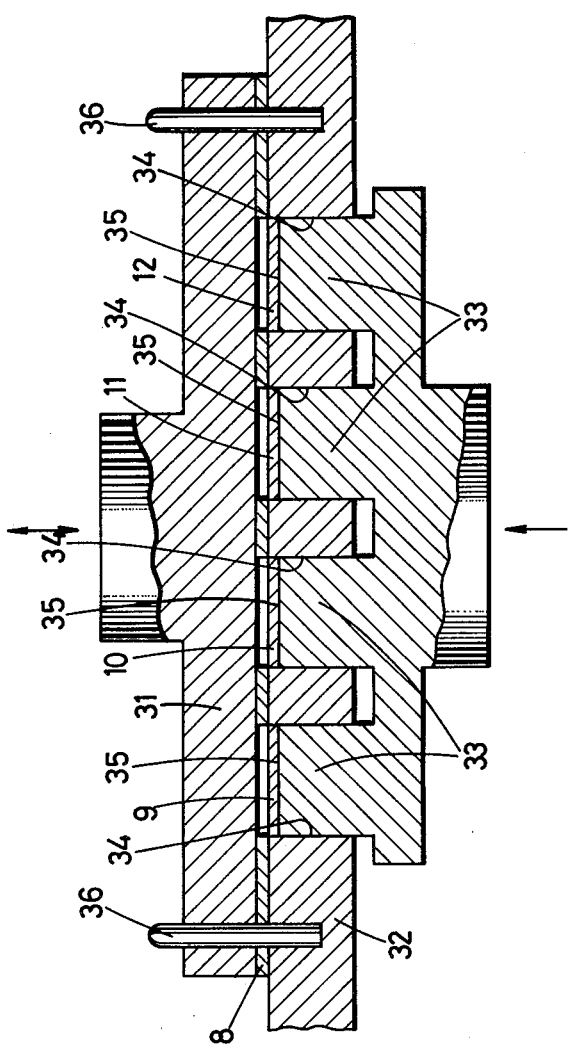
FIG. 6 is a sectional view illustrating the apparatus by which a daughter board is fitted into a mother board to form a composite circuit board.

The process represented by step 6, that is, the insertion of respective daughter boards into corresponding openings of mother board 8, may be carried out by the apparatus illustrated in FIG. 6. This apparatus is comprised of an upper mold 31, a lower mold 32 and a mold 33, the latter being referred to herein as a male mold. Lower mold 32 is provided with cavities 34 therein, each cavity being adapted to receive a corresponding portion of male mold 33. To carry out this compounding of the mother and daughter boards, male mold 33 is lowered with respect to lower mold 32 by a distance that is equal at least to the thickness of daughter boards 9, 10, 11 and 12. Mother board 8 is mounted on lower mold 32 and, as illustrated, is clamped between this lower mold and upper mold 31. Positioning pins 36 may extend between the upper and lower molds and may pass through suitable through-holes which are provided in mother board 8 for the purpose of accurately positioning the motor board in the illustrated apparatus. It is appreciated that, when male mold 33 is lowered, cavities 35 are formed between the upper surface of male mold 33, the side walls of cavvities 34 and the surrounding portions of mother board 8. Respective daughter boards 9, 10, 11 and 12 are received in these cavities 35 and, thus, are mounted upon the upper surface of male mold 33 in proper alignment with openings 4, 5, 6 and 7, respectively, of mother board 8. Then, male mold 33 is moved in the upward direction so as to insert the respective daughter boards into the corresponding openings of mother board 8, the latter remaining rigidly clamped between upper and lower molds 31 and 32, and being properly positioned by way of positioning pins 36. Thus, the daughter boards are press-fit into the corresponding openings of the mother board. Preferably, the openings in mother board 8 and corresponding ones of the daughter boards are of substantially identical shapes such that the daughter boards are effectively fixed to mother board 8 by means of friction.

After daughter boards 9, 10, 11 and 12 are press-fit into openings 4, 5, 6 and 7, respectively, by means of male mold 33, the male mold may be lowered, and then upper and lower molds 31 and 32 may be separated such that the composite board, formed of the fixed mother and daughter boards, may be removed from the illustrated apparatus. Thereafter, and as represented by step 7, a protective resin coating 37 is applied to the surface of composite board 30; and at least to the joints which are formed between the mother board and each of the daughter boards received thereby. For example, this protective resin coating may be an epoxy resin, an acrylate resin, or the like. These resins may be applied to composite board 30 by suitable printing techniques, such as a silk screen printing, or the like. This protective resin coating then is cured, as by applying heat, ultraviolet radiation, or the like, resulting in a protective coating on the surface of the composite board.

Figure 7:
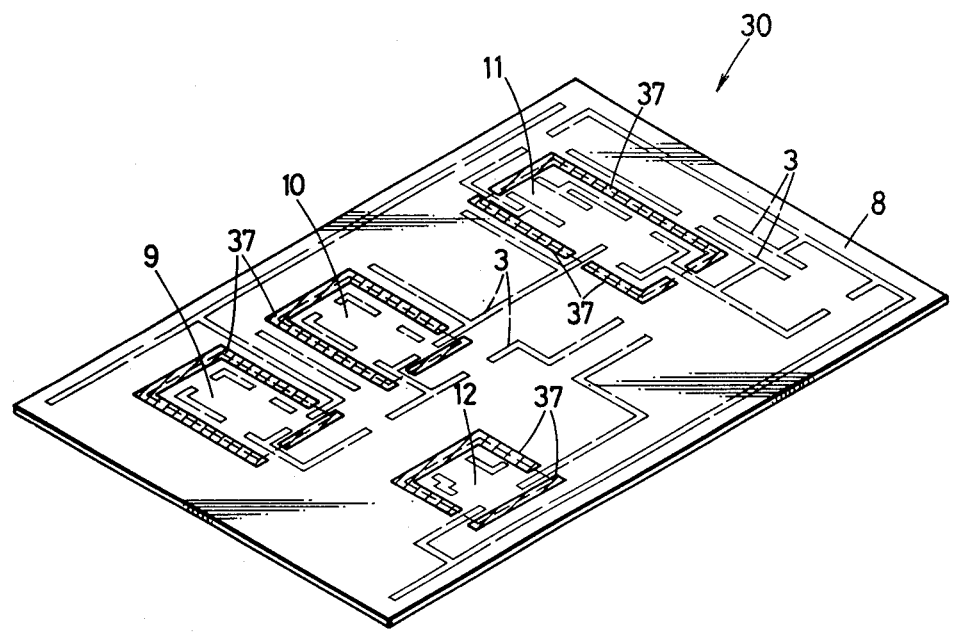
FIG. 7 is a perspective view of a composite circuit board upon which a protective resin coating is applied.
Figure 8:
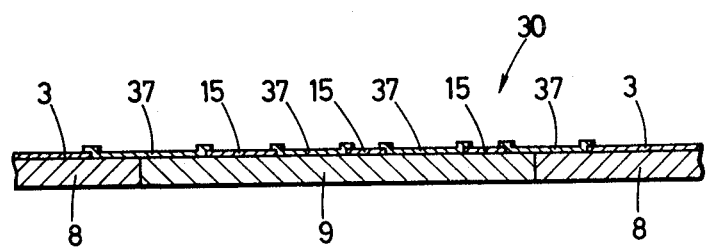
FIG. 8 is a sectional view of the circuit board shown in FIG. 7.

An example of the composite board having the protective resin coating 37 printed onto discrete areas thereof is illustrated in FIGS. 7 and 8. These figures merely illustrate the coating of the protective resin onto the joints formed between the mother board and the respective daughter boards. Protective resin 37 serves to strengthen these joints. In addition, although not shown, protective resin coating 37 is applied to other areas on the surface of composite board 30 for the purpose of forming a solder resist. Thus, on those portions of composite board 30 on which protective resin coating 37 is not applied, solder may be secured, as by dipping the composite board into a suitable solder bath. Resin coating 37 also may provide some form of insulation on the surface of the composite board.

To strengthen the joints between the mother board and each of the respective daughter boards, protective resin coating 37 may be applied with a thickness that is greater than the thickness of this protective resin coating at other areas. For example, the thickness of protective resin coating 37 which overlies the joints may be on the order of from 50 to 100 microns. Typically, the thickness of protective resin coating 37 which is used merely as a solder resist is on the order of from 10 to 20 microns. The curing of protective resin coating 37 on the joints between the mother and daughter boards further strengthens these joints. This adds to the structural integrity of composite board 30.

It may be appreciated that the application of protective resin coating 37 onto the surface of composite board 30 for the purpose of applying a solder resist is carried out simultaneously with the application of this protective resin coating for the purpose of strengthening the joints between the mother and daughter boards. That is, rather than applying this resin coating as a solder resist to mother board 8 as well as to respective ones of daughter boards 9, 10, 11 and 12 prior to the compounding thereof, and then, after such compounding, to apply another coating of resin 37 for the purpose of strengthening the joints, these two separate steps of applying the protective resin are combined into a single step. This has the advantage of improving the efficiency by which the electrical circuit apparatus of the present invention is manufactured.

After protective resin coating 37 is applied to the surface of composite board 30, and following the curing of this coating, a layer of insulating resin 38 is selectively deposited, as by silk screen printing or other conventional deposition techniques. FIG. 2 illustrates this selective deposition of insulating resin coating 38. As shown, portions of this resin are deposited upon both the upper and lower surfaces of composite board 30, and other portions of resin 38 are selectively deposited on protective resin coating 37. Resin 38 then is cured, as by heat, ultraviolet light, and the like. As a result thereof, insulating resin layer 38 is provided on portions of both surfaces of composite board 30, as well as on portions of protective resin coating 37. Although FIG. 2 illustrates both surfaces of the composite board having resin 38 deposited thereon, it is appreciated that, if desired, only one surface of board 30 may have this resin thereon. Furthermore, and advantageously, insulating resin coating 38 is deposited on the lower surface of composite board 30, overlying the joints formed between the mother and daughter boards. This serves to further strengthen the joints between these boards.

In addition to strengthening the joints between the mother and daughter boards, insulating resin coating 38 serves to insulate portions of the composite board, such as "crossing" patterns upon which circuit elements may be mounted. Also, the insulating resin coating may be mixed with a pigment such that, when printed on composite board 30, visual symbols, marks, lettering and the like may be printed.

It is appreciated that the advantageous effect of strengthening the joints between mother and daughter boards by insulating resin coating 38 is achieved without requiring a separate, additional step for this purpose. That is, since it is best to apply this insulating resin coating for the purposes of insulation or symbol-printing, the additional advantage of obtaining a strengthened joint is achieved merely by insuring that the printing of the insulating resin coating also overlies this joint. Hence, all of the advantages obtained by providing this insulating resin coating are achieved by carrying out only one step. This adds further to the efficiency of the manufacturing process in constructing the electrical circuit of the present invention.

If desired, additional strengthening of the joints between the mother and daughter boards may be achieved by applying yet another joining resin, overlying such joints, after insulating resin layer 38 has been applied and cured.

The resultant composite board 30, shown in FIG. 2, then is in condition to have circuit elements mounted thereon. One type of circuit element which can be mounted upon composite board 30 is a conventional, so-called "chip-type" circuit element. The chip-type circuit element is not provided with conductive leads. Rather, relatively short electrodes, which may resemble nubs, are provided at opposite ends of the casing, or housing, of the chip-type element. Furthermore, a chip-type element typically is provided with a cylindrical, or barrel-shaped housing, within which are formed a particular circuit element, such as a resistor, capacitor, transistor or integrated circuit. Of course, other chip-type elements are known, such as rectangular, flat housings, which also are provided merely with electrodes, which are to be distinguished from conductive leads.

Figure 9:
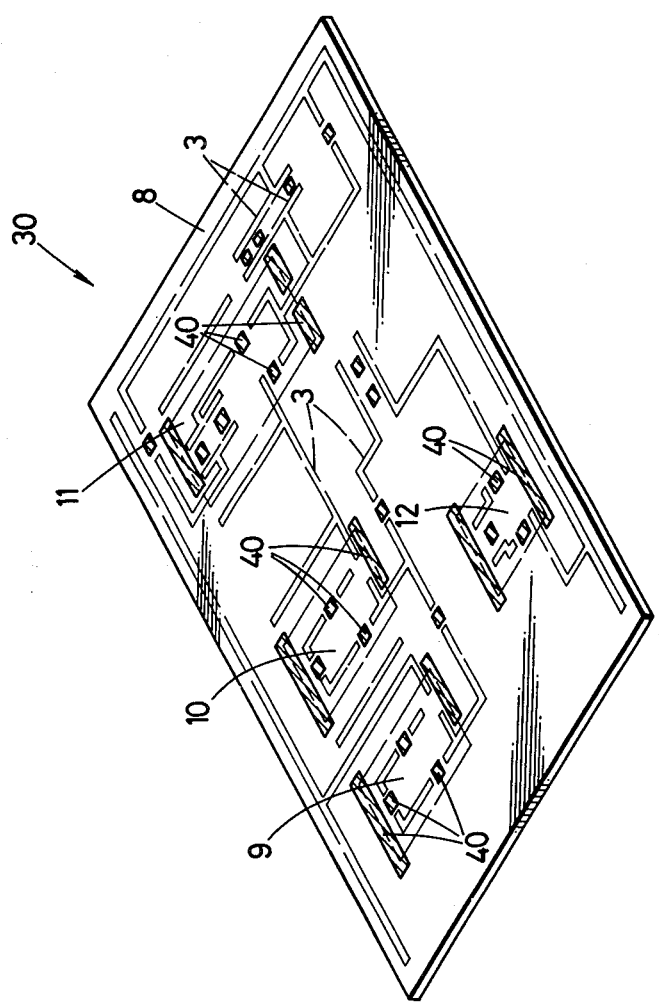
FIG. 9 is a perspective view illustrating a composite circuit board upon which an adhesive resin is coated so as to receive one type of circuit element.

To mount these chip-type elements on the surface of composite board 30, an adhesive resin 40, shown more particularly in FIG. 9, is applied to discrete locations on the surface of the composite board. This adhesive resin 40 is adapted to temporarily adhere, or affix, a chip-type element to the composite board. Such adhesion is made permanent by curing the adhesive resin coating, as by light-curing and/or heat-curing techniques. Also, and as illustrated in FIG. 9, adhesive resin 40 is applied to at least some of the joints between the mother and daughter boards. This increases the strength of these joints because, upon curing, the adhesive resin forms a structurally advantageous bond.

FIGS. 10A–10H schematically represent the apparatus, and operation thereof, which may be used to print adhesive resin areas 40 on composite board 30. This apparatus is comprised of a frame 41 coupled to a support assembly that is pivotably mounted upon a pivot pin 42. Pivot pin 42 is supported on a base 44 upon which composite board 30 also is supported. A screen 43 is secured to frame 41 and, thus, is rotatable about pivot pin 42. A scraper element, or blade 45 is movable towards and away from screen 43 by suitable control apparatus (not shown), and also is movable across the screen, from one side of frame 41 to the other, so as to scrape adhesive resin 40 across the upper surface of the screen. The adhesive resin is in a semi-fluid state such that, when scraped across screen 43 by scraper element 45, it penetrates into the mesh areas of the screen. It may be appreciated that the screen is arranged in a suitable pattern, as by blocking particular areas thereof with an impermeable material, or by arranging the mesh of the screen in a desired pattern, such that adhesive resin 40 is deposited upon composite board 30 in a corresponding pattern. The apparatus shown in FIG. 10 also is provided with a squeegee 46 which, like scraper element 45, is adapted to be moved toward and away from screen 43 and, moreover, to be driven from one side of frame 41 to the other.

Figure 10A:
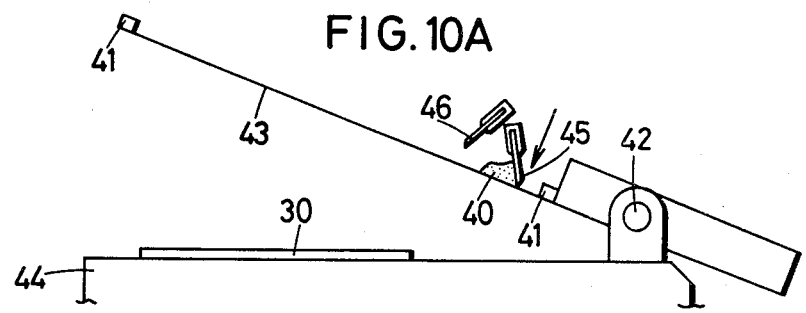
FIGS. 10A-10H are schematic representations of apparatus which is used to print the adhesive resin onto the composite circuit board.
Figure 10B:
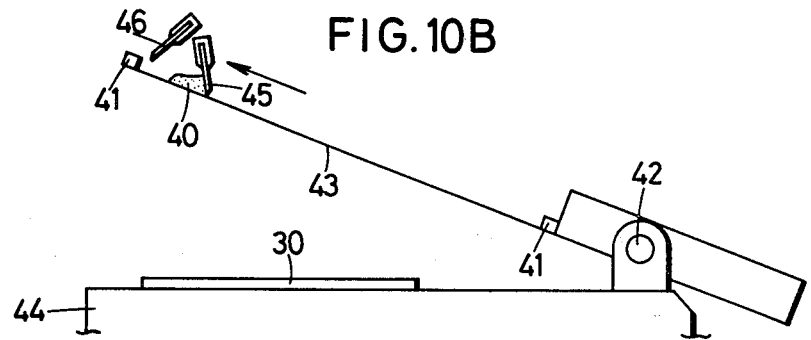

To print adhesive resin 40 upon the surface of composite board 30, frame 41 initially is rotatably displaced from the composite board, as shown in FIG. 10A. Scraper element 45 is moved toward the screen and then, as shown in FIG. 10B, both the scraper element and squeegee 46 are driven across the screen from the right-most side of frame 41 to the left. This is carried out while the screen remains displaced apart from composite board 30.

As scraper 45 moves across the upper surface of screen 43, adhesive resin 40, in its semi-fluid state, is scraped across the screen and penetrates into the mesh areas thereof. If these mesh areas are arranged in a predetermined pattern, or configuration, it is appreciated that the adhesive resin likewise is formed into this pattern. After scraper element 45 attains its left-most position on screen 43, it is withdrawn therefrom, that is, it is raised in the upward direction.

Figure 10C:
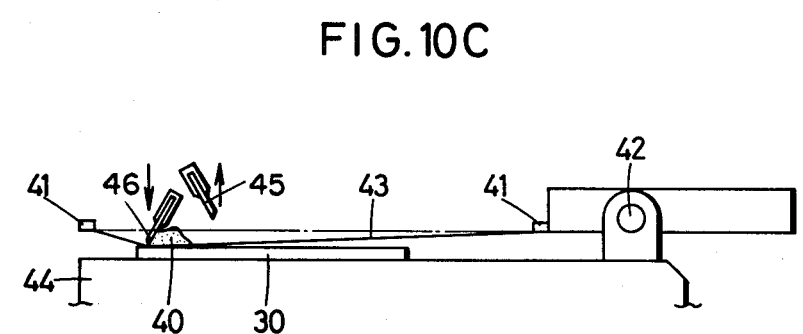
Figure 10D:
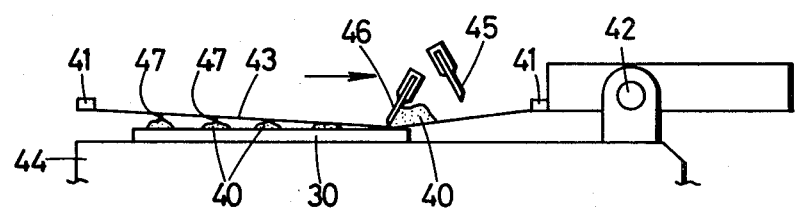
Figure 10E:
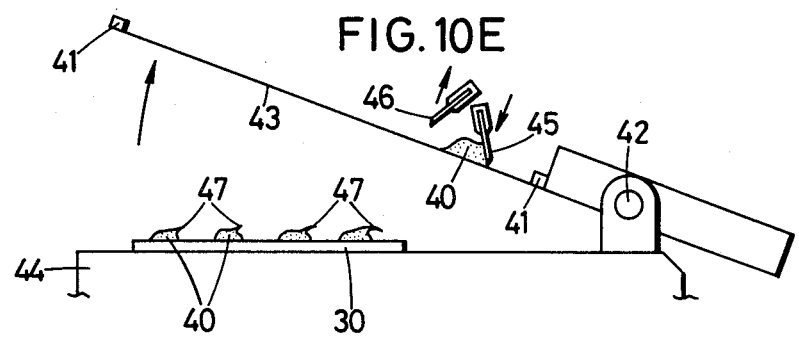
Figure 10F:
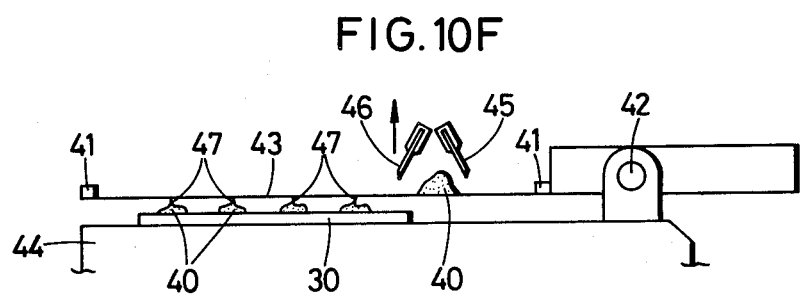

Thereafter, and as shown in FIG. 10C, frame 41 is lowered toward composite board 30. This rotary movement of the screen may be effected by various well-known devices, such as a crank arm driven by an hydraulic cylinder, whereby frame 41 is angularly displaced in the counter-clockwise direction about pivot pin 42. Suitable restraints or stop members (not shown) may be provided such that frame 41 and screen 43 are lowered such that the screen is parallel to the surface of composite board 30, but is spaced therefrom, as represented by the broken line in FIG. 10C. After screen 43 attains this position, which is illustrated as a horizontal position, squeegee 46 is lowered into contact therewith. More particularly, the squeegee is driven so as to displace the screen, which is flexible, into contact with the upper surface of composite board 30. That is, the point of contact of screen 43 and squeegee 46 is driven downwardly into further contact with the surface of the composite board, as illustrated by the solid line in FIG. 10C. Thereafter, squeegee 46 is driven in the left-to-right direction by suitable drive means (not shown). As the squeegee advances across screen 43, successive areas of the screen are displaced into physical contact with the surface of composite board 30. This forces adhesive resin 40 through the screen to be deposited in discrete areas upon the surface of the composite board, as shown in FIG. 10D. It is appreciated that the discrete areas, or pattern, of adhesive resin 40 upon composite board 30 correspond to the particular pattern, or configuration of screen 43. This pattern may exhibit the overall arrangement, or configuration, shown by the discrete areas of adhesive resin 40 in FIG. 9.

It is seen, from FIG. 10D, that after squeegee 46 passes over a particular location of screen 43, that portion of the screen is displaced from the surface of composite board 30 so as to return to its spaced-apart position. Because adhesive resin 40 is in its semi-fluid state, this upward movement of screen 43 away from the surface of composite board 30 results in the formation of resin threads 47 which serve to link the deposited areas of the adhesive resin to the screen.

After squeegee 46 has been returned to its rightmost position with respect to frame 41, it is withdrawn from the surface of screen 43. Thereafter, frame 41, together with screen 43, is pivoted about pivot pin 42 in the clockwise direction, so as to return the screen to its initial position. If this clockwise rotation of the frame and screen is commenced immediately after squeegee 46 reaches its right-most position, resin threads 47 (FIG. 10E) are stretched and, ultimately, will break. The stretching of the resin threads 47 tends to elongate such threads, whereupon, upon the breakage thereof, the threads may fall upon certain areas of composite board 30 so as to contact the pattern of conductive leads thereon. Such contact of adhesive resin threads 47 with a pattern of conductive leads may interfere with the conductivity of such leads and, moreover, may prevent solder from being deposited upon such areas. This has a deleterious effect upon the operation of the circuit which is formed on the composite board.

Figure 10G:
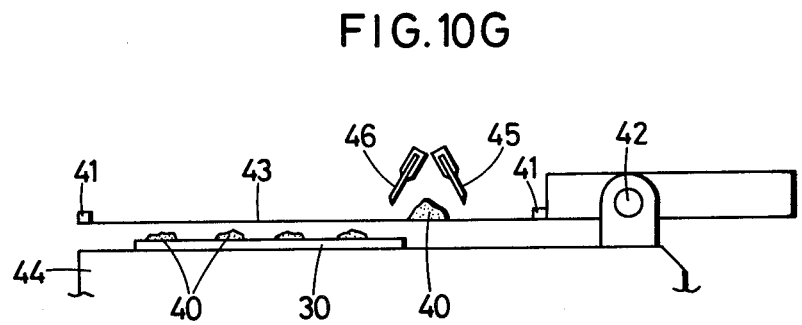
Figure 10H:
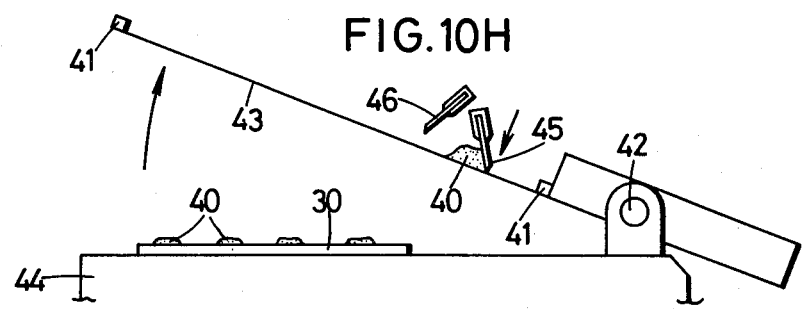

To overcome this problem attributed to adhesive resin threads being elongated due to the rotation of screen 43 and, thus, falling into contact with portions of composite board 30, the process which is used to form the electrical circuit of the present invention maintains frame 41 in its generally horizontal position (shown in FIG. 10F) for a predetermined time duration following the removal of squeegee 46 from the surface of screen 43. In particular, frame 41 is maintained in the position shown in FIG. 10F for about two to six seconds following the removal of the squeegee from the screen. This permits resin threads 47 to return to the coated areas of adhesive resin 40, as shown in FIG. 10G. Thus, although these threads 47 are broken, they do not bend over, or extend into contact with the surface of composite board 30. Rather, they merely fall back into the respective areas of the adhesive resin. Furthermore, the fluidity of resin 40 results in substantially flat-topped areas on the surface of the composite board. Then, following this delay, frame 41 is rotated about pivot pin 42 in the clockwise direction so as to lift screen 43 away from composite board 30. This is shown in FIG. 10H. As a result thereof, composite board 30 has printed thereon the discrete areas of adhesive resin 40 shown in FIG. 9. Furthermore, the undesired occurrence of resin threads 47 contacting the surface of the composite board, and particularly, the conductive pattern thereon, is avoided.

After frame 41 is rotated away from composite board 30, scraper element 45 is lowered onto the surface of screen 43, in preparation for another printing operation for the next composite board.

In one embodiment, screen 43 may be constructed of a Tetron mesh that is coated with a resin on both surfaces thereof. The thickness of the resin-coated screen may be such as to be substantially equal to the thickness of the layer of adhesive resin 40 that is to be coated onto composite board 30. As one example thereof, this thickness may be on the order of from 400 to 500 microns. Of course, the actual thickness which is used may vary from this range, and is determined by the type of composite board upon which the adhesive resin is printed, as well as the circuit operations which are to be performed by the circuit elements mounted on the composite board, and the types of circuit elements which are used. It may be appreciated that, if desired, the resin-coating of the screen may be used to block certain mesh portions so as to prevent adhesive resin 40 from passing therethrough into contact with composite board 30. That is, the resin-coating of screen 43 may serve as a desired pattern or template which is complementary to the pattern of adhesive resin 40 deposited upon composite board 30.

Figure 11:
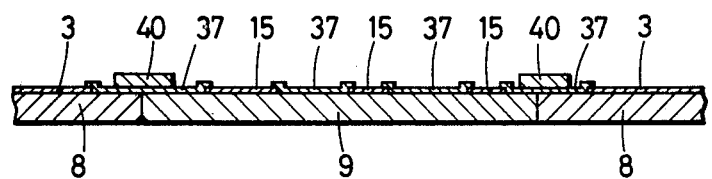
FIG. 11 is a cross-sectional view of the composite board shown in FIG. 9.

Adhesive resin 40 may be applied directly to the surface of composite board 30, or may overlie insulating resin coating 38 or protective resin coating 37. As mentioned above, and as shown in FIG. 9, it is advantageous to print adhesive resin 40 on at least some of the joints between mother board 8 and the respective daughter boards compounded therewith. When the adhesive resin coating is cured, as by light-curing or heat-curing techniques, the bond formed thereby tends to strengthen such joints. It is appreciated that adhesive resin 40 may be applied to particular areas on the surface of composite board 30, upon which circuit elements will be fixed, as well as to the joints between the mother and daughter boards, in a single step, or operation. FIG. 11 illustrates areas of adhesive resin 40 which overlie such joints between mother board 8 and daughter board 9. In this figure, the adhesive resin is seen to overlie protective resin coating 37.

Figure 3B:
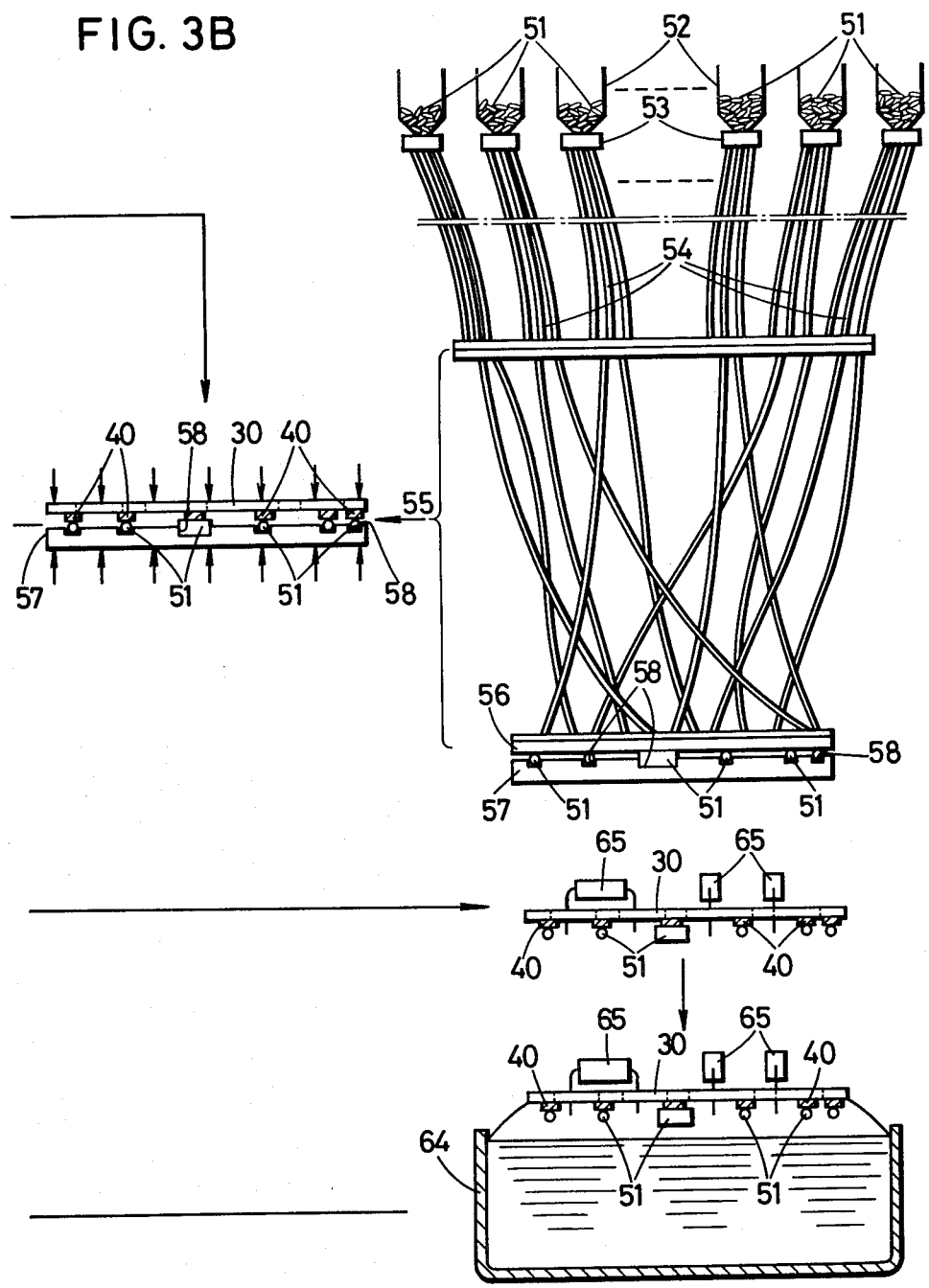

After adhesive resin 40 is printed onto the surface of composite board 30, as shown in FIG. 9, chip-type circuit elements are adhesively fixed to the composite board by bringing such elements into contact with respective ones of adhesive resin areas. FIG. 3 is a schematic illustration of apparatus which can be used to adhesively mount such chip-type circuit elements onto composite board 30. FIG. 3 also illustrates, schematically, the printing of areas of adhesive resin 40 onto the surface of composite board 30. This printing may be carried out by the apparatus discussed above with respect to FIGS. 10A-10H.

Chip-type circuit elements 51 are adapted to be temporarily fixed to composite board 30 by adhesive resin 40. As shown in the upper right-hand portion of FIG. 3, these chip-type elements which, preferably, are of uniform shape, such as cylindrical, or barrel-shaped elements, may be capacitors, resistors, cross-conductors, jumper-elements, diodes, and the like. These chip-type elements are diposed in containers 52 of a suitable hopper (not shown). Elements 51 are supplied, or charged, from containers 52 via carrier pipes 54 to a magazine, indicated generally by reference numeral 55. The charging of these elements may be carried out intermittently. A shutter apparatus 53, disposed at the outlet of each of containers 52, may be used to charge the elements to the magazine. Respective ones of elements 51 are placed in corresponding positions in the magazine, depending upon the particular size of each element. This enables elements 51 to be disposed randomly in containers 52. Nevertheless, because of the particular sizes of these elements, the proper element is directed to the proper location in magazine 55. Thereafter, the respective elements are supplied to a disposition plate 56 whereat they are arranged in predetermined configuration. For example, if each element 51 is cylindrical, the axes of these elements are aligned in predetermined directions. As illustrated, these predetermined alignments may be normal to the plane of the drawings, or parallel thereto. A shutter mechanism is disposed beneath plate 56 and, when opened, the aligned elements 51 are transferred from plate 56 into corresponding recesses 58 of a template 57. Thus, elements 51 may be randomly disposed in containers 52 but, by reason of magazine 55, proper ones of these elements are fed to corresponding recesses 58 in template 57, and are aligned in a predetermined manner so as to be received by such recesses.

As also shown in FIG. 3, composite board 30, having areas of adhesive resin 40 thereon, is superposed with respect to template 57. Accordingly, elements 51, which are disposed in recesses 58 of template 57 are aligned with such adhesive resin areas. A relatively light pressure is applied to secure elements 51 to the adhesive resin on composite board 30. Thereafter, composite board 30 and template 57, which are in overlying relationship with each other, are rotated, or "flipped" such that temmplate 57 now overlies composite board 30. Further pressure now is applied by suitable apparatus (not shown) to further secure elements 51 to composite board 30. Moreover, since these elements are assumed to be chip-type circuit elements having cap-like electrodes at opposite ends thereof, these electrodes are urged into electrically conductive contact with the conductive patterns provided on the composite board. Then, after elements 51 are satisfactorily secured to the composite board, template 57 is removed. Hence, the chip-type circuit elements 51 are transferred from template 57 to composite board 30.

Composite board 30, having chip-type elements 51 adhesively mounted thereon, is supplied to a light-curing furnace 62, for example, by means of a suitable conveyor 61, such as a belt conveyor. Light-curing furnace 62 serves to cure the surface areas of adhesive resin 40. Then, conveyor 61 conveys composite board 30 from light-curing furnace 62 to a heat-curing furnace 63. Furnace 63 fully cures adhesive resin 40. Thus, elements 51 are securely mounted on composite board 30 and, moreover, the joints between the mother and daughter boards upon which adhesive resin 40 have been printed, are further strengthened.

This two-step curing process is preferred because it reduces the overall time required for the curing of adhesive resin 40. The introduction of composite board 30 into heat-curing furnace 63 results in a decrease in the viscosity of the adhesive resin. If the pre-curing step achieved in light-curing furnace 62 is omitted, this decrease in viscosity of the adhesive resin would result in undesired flow thereof. Such resin flow will degrade the adhesion of the circuit elements to composite board 30 and, moreover, may cover some of the patterns of conductive leads with such resin, thereby producing defective electrical connections. However, the effect of light-curing furnace 62 is to cure the outer surface of adhesive resin 40. This prevents the unwanted flow of resin in heat-curing furnace 63.

In the steps described thus far, chip-type circuit elements 51 are mounted upon the upper surface of composite board 30. After passing through the curing furnaces, composite board 30 is in condition to have other circuit elements 65, such as those circuit elements normally provided with conducting leads, mounted on the rear, or lower surface thereof. Such circuit elements 65 are mounted thereon, with their conductive leads passing through through-holes, if the particular nature and structure of the electrical circuit requires such elements. Since circuit elements are mounted on both surfaces of composite board 30, it is appreciated that a relatively high density of circuit components is achieved, yet there are no localized areas of concentration of such circuit elements.

Thereafter, composite board 30, having elements 51 and 65 mounted thereon, is immersed in a solder dipping bath 64. Preferably, the surface of the composite board upon which most of the conductive patterns are provided is immersed into the solder bath. Thus, solder provides good electrical connections between the respective circuit elements and the conductive patterns. In addition, solder may be applied to bridge a conductive pattern on a daughter board with a matching conductive pattern on the mother board. The resultant solder connections are illustrated in FIG. 3.

If desired, and if the particular nature and function of the circuit permit, circuit elements 65 having the usual conductive leads may be omitted from composite board 30.

Figure 12:
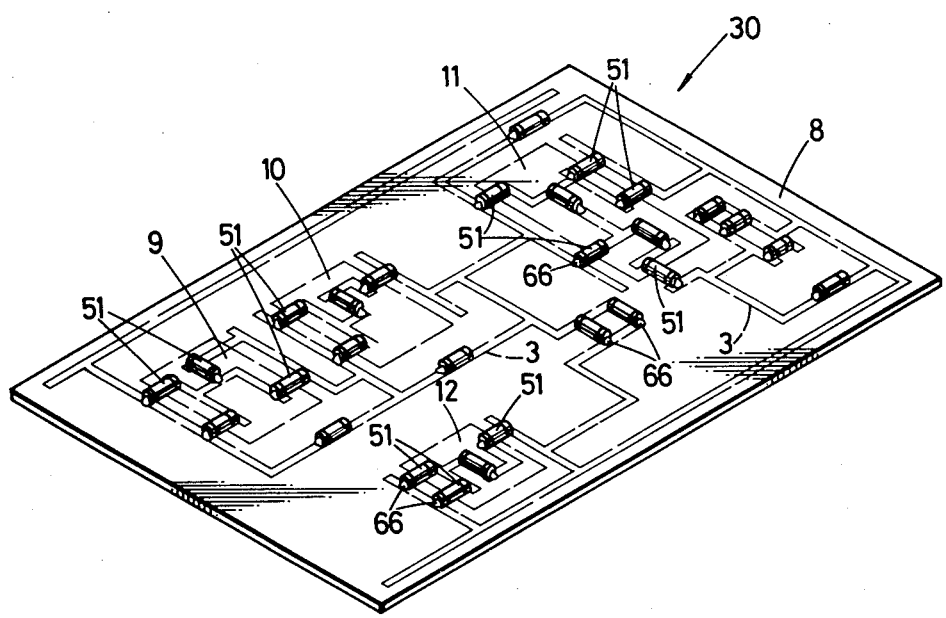
FIG. 12 is a perspective view of the composite circuit board upon which one type of circuit element is mounted.

As shown in FIG. 3, at least one of chip-type circuit elements 51 has one of its electrodes secured to a conductive lead on mother board 8 and the other of its electrodes secured to a conductive lead on a respective one of the daughter boards. That is, this chip-type circuit elements serves to electrically interconnect the mother board with one of its daughter boards. This bridging of the joint between the mother and daughter boards by chip-type circuit element 51 further strengthens the joint. This is particularly illustrated in FIG. 12, in which various chip-type circuit elements 51 provide an electrical interconnections between conductive leads on mother board 8 and conductive leads on daughter board 9, even though these elements may be adhesively secured either to the mother board or to the daughter board. Nevertheless, such elements serve as a bridging between the mother and daughter boards, thereby strengthening the joint therebetween.

Figure 13:
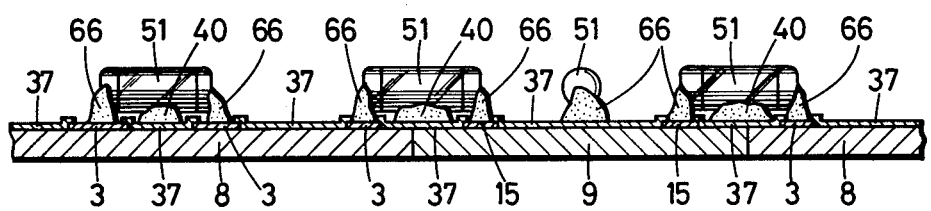
FIG. 13 is a sectional view of the circuit board shown in FIG. 12.

As shown in FIG. 13, adhesive resin 40 is applied to the joint between mother board 8 and daughter board 9, and a chip-type circuit element 51 is adhesively mounted on this adhesive resin. When the adhesive resin is cured, the joint is strengthened and circuit element 51 is securely mounted to the composite board. As also shown, solder 66 connects one end of this circuit element to conductive lead 3 on mother board 8, and solder also connects the other end of this circuit element to conductive lead 15 on daughter board 9. Hence, element 51 serves as a bridge across the joint, thereby improving the strength thereof.

Thus, it is appreciated that, by depositing adhesive resin 40 in the vicinity of, or on, the junctions between the mother daughter boards, those circuit elements which are fixed to such adhesive resin serve to strengthen such joints. Also, circuit elements 51 may be electrically connected to conductive patterns 3 and 15 provided on mother board 8 and daughter board 9, respectively, for example, thereby electrically interconnecting the mother and daughter boards without requiring any other direct connection between these conductive leads.

Figure 14:
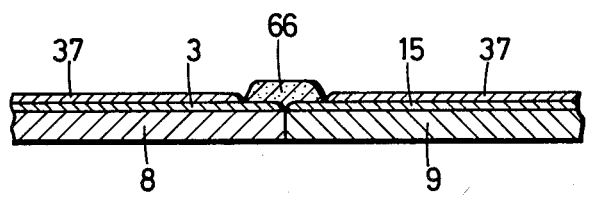
FIG. 14 is a sectional view of a joint defined by mother and daughter boards.

Although FIG. 13 illustrates the use of circuit elements 51 to interconnect the conductive leads on the mother and daughter boards, solder 66, which is deposited by immersing composite board 30 in solder bath 64, may join, or electrically connect, these conductive leads. As shown in FIG. 14, solder 66 is deposited upon the joint between mother board 8 and daughter board 9 so as to electrically interconnect conductive leads 3 and 15, thereby bridging this joint. FIG. 14 also illustrates a gap in protective resin coating 37 at the joint, this gap permitting solder 66 to electrically interconnect the conductive leads. It is appreciated that the conductive leads of other daughter boards may be electrically connected to the conductive leads of mother board 8 in a similar manner. Of course, the step by which the conductive leads are interconnected as shown in FIG. 14 is carried out concurrently with the soldering of elements 51 and 65 to the composite board. Hence, a separate step to achieve the interconnection shown in FIG. 14 is unnecessary.

Figure 15:
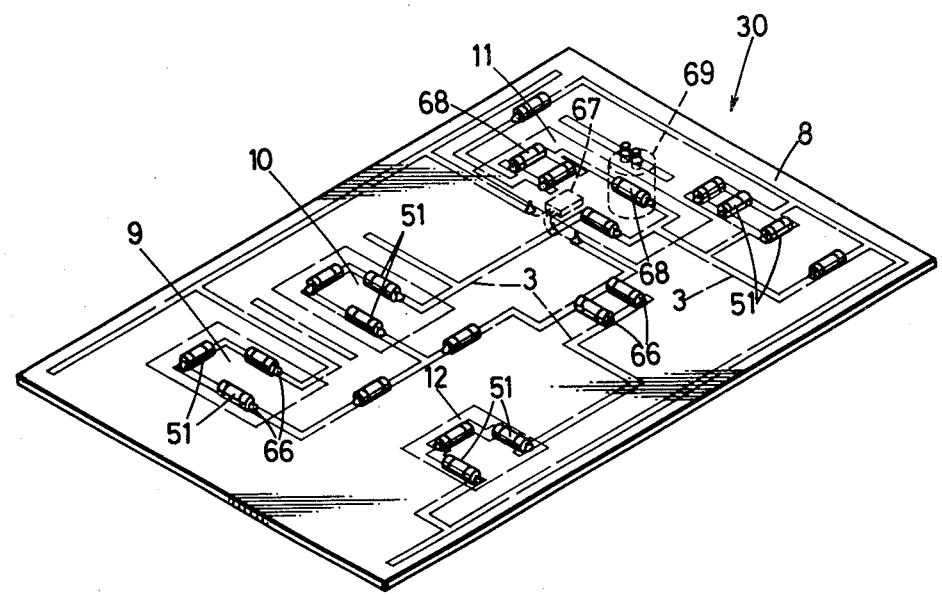
FIG. 15 is a perspective view of a completed electrical circuit, in accordance with the present invention.
Figure 16:
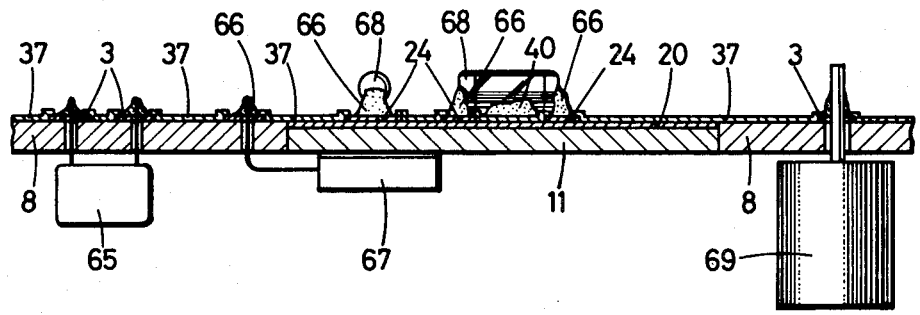
FIG. 16 is a sectional view of the completed circuit shown in FIG. 15.

In the example described hereinabove, it has been assumed that daughter board 9 is formed of a glass epoxy resin and, thus, may be used as a high performance circuit, such as an audio pre-amplifier. Also, daughter board 10 has been assumed to be formed of alumina ceramic having good high frequency characteristics so as to be used with superhigh frequency circuitry, such as a high frequency tuner. Daughter board 11 has been assumed to be constructed of aluminum having a relatively high coefficient of thermal diffusion and, thus, may be used with a power amplifier. Daughter board 12 has been assumed to be of a phenolic resin, but is provided with patterns of conductive leads on both surfaces thereof, thereby facilitating a lower mounting density of circuit elements. As an example of the foregoing, FIG. 15 illustrates that daughter board 11, which is constructed of aluminum, may function as a heat sink and, thus, has an exothermic circuit mounted thereon, such as a power transistor 67 and/or a resistor 68. Thus, daughter board 11 may have circuit elements mounted thereon which, in electrical combination, form a power amplifier. FIG. 16 illustrates power transistor 67 mounted on daughter board 11, but having an extended conductive lead which passes through a through-hole in mother board 8 to be electrically connected to a conductive lead 3 on the mother board by solder 66. Thus, although the exothermic circuit 67 is mounted on daughter board 11, the latter having a preferable coefficient of thermal diffusion, and thus being able to dissipate the greater amount of heat which is generated during operation of circuit 67, the electrical connection between this circuit element and the remaining circuitry is achieved by connecting the conducting lead of circuit element 67 through mother board 8 to a conductive lead thereon. If power transistor 67 is to be used with a capacitor, such as a chemical condenser 60, the condenser is a thermally weak element and, thus, should not be mounted on the same aluminum daughter board as the power transistor. This is because the aluminum daughter board is heated during operation of power transistor 67 to a relatively high temperature, on the order of, for example, 80° C. to 120° C. By mounting thermally weak condenser 69 on mother board 8, the high temperature of aluminum daughter board 11 is not transferred to, and thus does not deleteriously affect chemical condenser 69. Thus, circuit elements which generate a relatively large amount of heat during operation are mounted on daughter board 11, and circuit elements which generate a lesser amount of heat are mounted on mother board 8. Of course, these respective elements are electrically interconnected by the pattern of conductive leads formed of leads 3 on mother board 8 and leads 24 on daughter board 11. Since mother board 8 is formed of a phenolic resin, which exhibits relatively poor heat transferability, condenser 69 is not heated by the substantial rise in temperature of aluminum daughter board 11.

It also is appreciated that, since aluminum daughter board 11 is electrically conductive, if a through-hole is formed therein so as to permit a lead of, for example, power transistor 67, to pass therethrough, this through-hole should be insulated at its inner periphery. Since the formation of such an insulated through-hole is relatively difficult, it is preferred, as illustrated in FIG. 16, to provide the through-hole in mother board 8. Power transistor 67 is mounted on daughter board 11 in the vicinity of the joint between the mother and daughter boards, such that the electrical lead normally provided on power transistor 67 may extend therefrom through the through-hole of the mother board. Also, a circuit element 65 may be mounted on the reverse surface of mother board 8, with its conducting leads passing through suitable through-holes of the motor board. These conducting leads are electrically connected to conductive pattern 3 on the upper surface of mother board 8 by means of solder. Likewise, condenser 69 may be provided with conducting leads which pass through suitable through-holes of mother board 8, to be electrically connected to conductive pattern 3 by means of solder.

Figure 17:
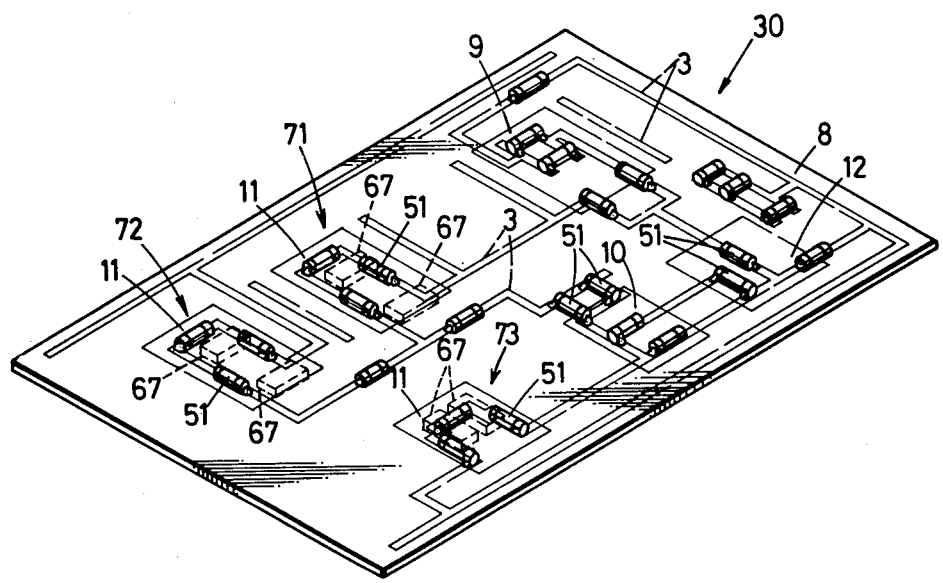
FIG. 17 is a perspective view of another embodiment of the electrical circuit in accordance with the present invention.

FIG. 17 illustrates a circuit comprised of composite board 30, in accordance with the teachings of the present invention. Composite board 30 is comprised of a plurality of aluminum daughter boards 11 which, is as recognized, facilitate the mounting of exothermic circuits thereon. The circuit illustrated in FIG. 17 may be readily adapted for use in stereo audio apparatus wherein, for example, a low frequency amplifier circuit 71 for the right (R) channel may be provided on one daughter board 11, and wherein another low frequency amplifier circuit 72 for the left (L) channel may be provided on another daughter board 11. These low frequency amplifier circuits may be self-contained; that is, they may comprise complete circuits in and of themselves without requiring connection to additional circuit elements located on different portions of the composite board. Furthermore, these lower frequency amplifier circuits include one or more exothermic circuit elements. Hence, the use of aluminum daughter boards 11 facilitates the dissipation of heat generated by such exothermic circuits. Additionally, a power amplifier circuit 73 may be mounted on yet another aluminum daughter board 11.

It is seen that, by providing individual daughter boards 11, those circuits (i. e. the low frequency amplifiers and power amplifier) which generate substantial amounts of heat do not deleteriously affect other circuits which may be mounted on composite circuit board 30. Furthermore, if one or more of the circuits mounted on daughter boards 11 becomes defective, that particular circuit may be replaced without requiring replacement of the entire composite board.

Figure 18:
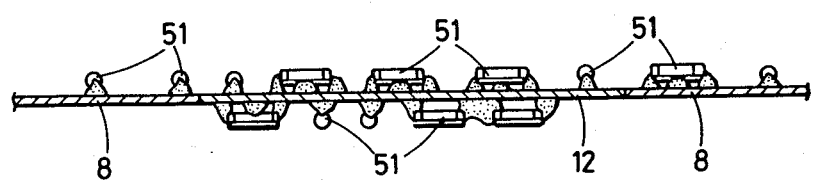
FIG. 18 is a sectional view of yet another embodiment of the electrical circuit in accordance with this invention.

As illustrated in FIG. 18, daughter board 12 is provided with circuit elements 51 on both surfaces thereof. Thus, conductive patterns are formed on the upper and lower surfaces of daughter board 12; and circuit elements 51 are mounted on the daughter board and electrically connected to these conductive patterns. Thus, a relatively large number of circuit elements may be mounted on daughter board 12, but by mounting such circuit elements on both surfaces of the daughter board, an undesired concentration of circuit elements in a localized area is avoided. Furthermore, since only daughter board 12 is provided with circuit elements on both surfaces thereof, only this daughter board need be provided with a conductive pattern on such surfaces. That is, it is not necessary to provide a conductive on both surfaces of mother board 8. This reduces the overall cost of manufacture of the circuit.

While the present invention has been particularly shown and described with reference to certain preferred embodiments, it will be readily apparent that various changes and modifications in form and details may be made without departing from the spirit and scope of the invention. One or more openings may be provided in mother board 8, into which corresponding daughter boards are fitted. The particular construction of each daughter board that is used is dependent upon the characteristics of and function to be carried out by the particular circuit that is mounted on that daughter board. Thus, circuit boards which, heretofore, have not been capable of having different types of circuits mounted thereon, thus requiring the use of several circuit boards, now are replaced by a single composite board having different circuits mounted thereon, which circuits previously had been incompatible for mounting on such a single circuit board. Since the mother board is formed of relatively inexpensive material, such as a phenolic resin, the overall cost of materials of the composite circuit board is maintained low. Thus, the circuit apparatus which is mounted on a single composite board may be used in various different applications, such as in audio apparatus, data recording/playback apparatus, video apparatus, and the like.

It is intended that the appended claims be interpreted as including various changes and modifications.

What is claimed is:

1. Electric circuit apparatus comprising a mother board having a pattern of conductive leads disposed on a surface thereof and including at least one opening therein of predetermined size and shape; at least one daughter board of substantially the same size and shape as said opening, and being structurally distinct from said mother board, said daughter board being of substantially the same thickness as said mother board and being disposed in said opening, and said daughter board having a pattern of conductive leads disposed on a surface thereof; electrical circuit components mounted on said mother board and daughter board, and having electrodes electrically connected to the patterns of conductive leads of said mother and daughter boards; at least some of the patterns of conductive leads on said mother and daughter boards being electrically interconnected; and at least one of said electrical circuit components bridges the joint between said mother and daughter boards to provide electrical interconnection between a conductive lead on said mother board and a conductive lead on said daughter board and is substantially rigidly secured to both said boards to add mechanical strength to said joint.

2. The apparatus of claim 1 further comprising a coating of at least one layer of resin on respective joints between said mother board and said at least one daughter board to strengthen said joints.

3. Electrical circuit apparatus comprising a mother board having a pattern of conductive leads disposed on a surface thereof and including at least two openings therein of respectively predetermined size and shape; at least two daughter boards of substantially the same size and shape as respective ones of said openings, each being structurally distinct from said mother board and from each other, each being of substantially the same thickness as said mother board and each being disposed in a respective one of said openings, whereby said mother and daughter boards form, in combination, a composite board; respective patterns of conductive leads disposed on at least one surface of each of said daughter boards, at least one conductive lead on at least one daughter board being electrically connected to at least one conductive lead on said mother board; and electrical circuit components mounted on said mother and daughter boards and having electrodes electrically connected to respective conductive leads thereon, at least one of said electrical circuit components being connected between a conductive lead on said mother board and a conductive lead on a daughter board and being substantially rigidly secured to both said boards, thereby bridging the joint between said mother and daughter boards to add mechanical strength to said joint.

* * * * *